US011606869B2

(12) United States Patent
Pandey et al.

(10) Patent No.: US 11,606,869 B2
(45) Date of Patent: Mar. 14, 2023

(54) ADAPTERS FOR ELECTRONIC CONTROL UNIT

(71) Applicant: Cummins Inc., Columbus, IN (US)

(72) Inventors: Nikhil Pandey, Columbus, IN (US); Daniel R. Harshbarger, Columbus, IN (US); William D. Meyer, Columbus, IN (US); Mark Swain, Columbus, IN (US)

(73) Assignee: Cummins Inc., Columbus, IN (US)

( * ) Notice: Subject to any disclaimer, the term of this patent is extended or adjusted under 35 U.S.C. 154(b) by 0 days.

(21) Appl. No.: 17/547,891

(22) Filed: Dec. 10, 2021

(65) Prior Publication Data

US 2022/0174826 A1 Jun. 2, 2022

Related U.S. Application Data

(62) Division of application No. 16/991,298, filed on Aug. 12, 2020, now Pat. No. 11,202,380, which is a division of application No. 16/098,945, filed as application No. PCT/US2016/031134 on May 6, 2016, now Pat. No. 10,750,628.

(51) Int. Cl.
*H01R 12/00* (2006.01)
*H05K 5/00* (2006.01)
*H01R 12/70* (2011.01)
*H01R 13/52* (2006.01)
*H01R 31/06* (2006.01)
(Continued)

(52) U.S. Cl.
CPC ....... *H05K 5/0069* (2013.01); *H01R 12/7082* (2013.01); *H01R 13/5219* (2013.01); *H01R 31/06* (2013.01); *H05K 5/0065* (2013.01); *H01R 12/73* (2013.01); *H01R 12/79* (2013.01)

(58) Field of Classification Search
CPC .... H01R 12/73; H01R 12/79; H01R 12/7082; H01R 13/5219; H01R 31/06; H05K 5/0065; H05K 5/0069
USPC .............................................. 439/55, 65, 67
See application file for complete search history.

(56) References Cited

U.S. PATENT DOCUMENTS 3,573,704 A 4/1971 Tarver
4,050,093 A 9/1977 Crall et al.
(Continued)

FOREIGN PATENT DOCUMENTS

KR 101418683 7/2014
WO WO-99/34112 A2 7/1999

OTHER PUBLICATIONS

International Search Report and Written Opinion for International Application No. PCT/US2016/031134, dated Sep. 13, 2016, 12 pages.

*Primary Examiner* — Khiem M Nguyen
(74) *Attorney, Agent, or Firm* — Foley & Lardner LLP

(57) ABSTRACT

An engine control system includes an integrated engine control module assembly having an engine control module and an adapter module. The integrated engine control module assembly further includes a first connector, a second connector, and a hermetic enclosure. The first connector includes a connection circuit configured to connect the integrated engine control module assembly to engine hardware. The second connector is configured to connect the adapter module to engine hardware. The hermetic enclosure houses the engine control module and is configured to protect the engine control module from environmental conditions.

19 Claims, 10 Drawing Sheets

(51) Int. Cl.
   *H01R 12/73*      (2011.01)
   *H01R 12/79*      (2011.01)

(56) References Cited

U.S. PATENT DOCUMENTS

| | | |
|---|---|---|
| 4,800,461 A | 1/1989 | Dixon et al. |
| 5,201,671 A | 4/1993 | Elias |
| 6,465,905 B1 | 10/2002 | Tsubaki |
| 7,337,088 B2 | 2/2008 | Velichko et al. |
| 7,726,456 B2 | 6/2010 | Ha |
| 7,930,079 B2 | 4/2011 | Toya et al. |
| 8,065,126 B2 | 11/2011 | Dong et al. |
| 8,295,995 B2 | 10/2012 | Poisson |
| 10,214,163 B2 | 2/2019 | Grimm et al. |
| 2007/0131513 A1 | 6/2007 | Ha |
| 2015/0375695 A1 | 12/2015 | Grimm et al. |
| 2016/0018349 A1 | 1/2016 | Harshbarger |
| 2019/0098778 A1* | 3/2019 | Pandey .................. H01R 31/06 |
| 2022/0174826 A1* | 6/2022 | Pandey ................ H05K 5/0065 |

\* cited by examiner

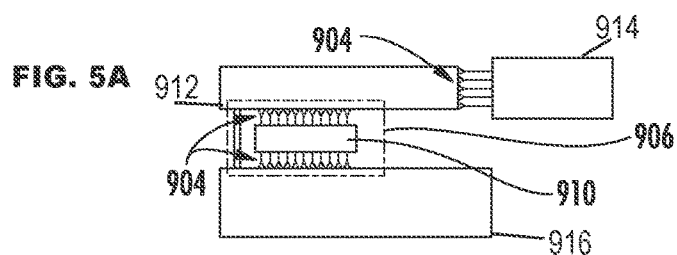
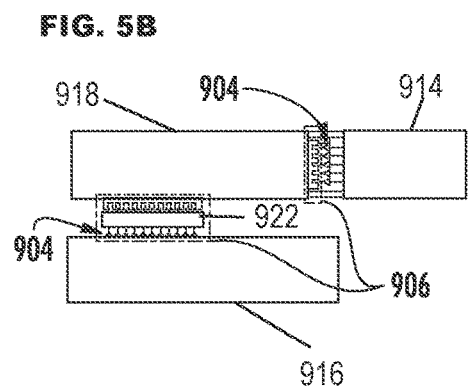
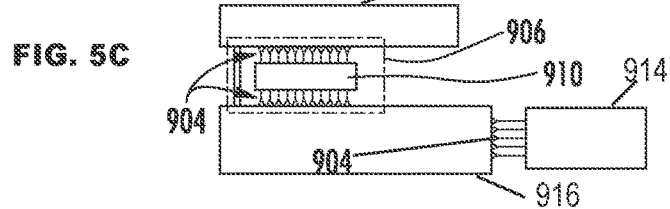
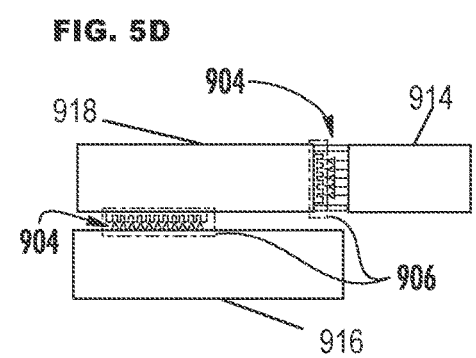
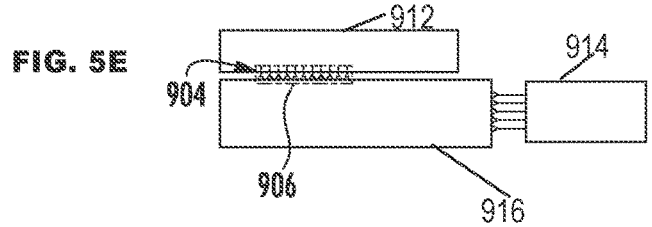
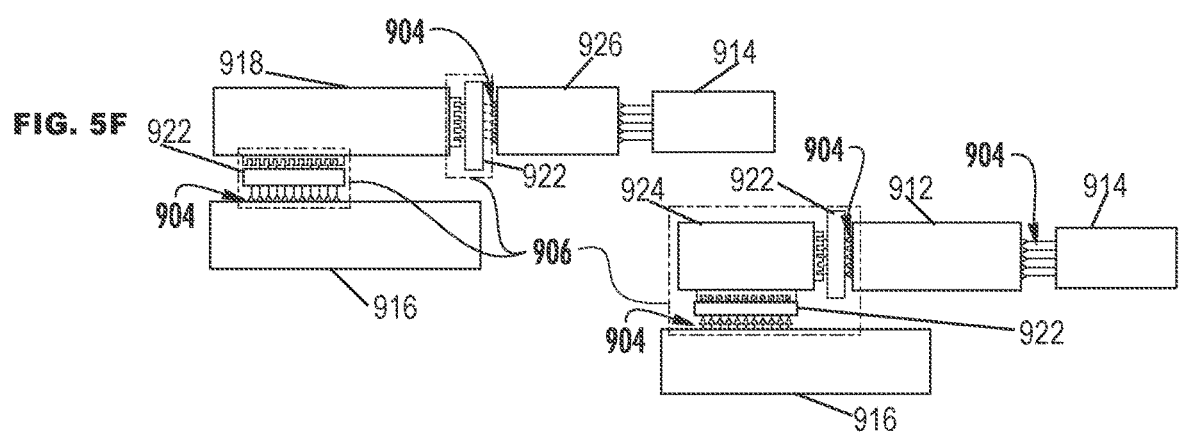

ADAPTERS FOR ELECTRONIC CONTROL UNIT

CROSS-REFERENCE TO RELATED APPLICATIONS

This application is a divisional of and claims priority to U.S. patent application Ser. No. 16/991,298 filed Aug. 12, 2020, which is a divisional of and claims priority to U.S. patent application Ser. No. 16/098,945, filed Nov. 5, 2018, now U.S. Pat. No. 10,750,628, which is the U.S. national stage entry of International Patent Application No. PCT/US2016/031134 filed May 6, 2016, the entire contents of which are incorporated herein by reference.

TECHNICAL FIELD

The present disclosure relates to connectors and adapters for an electronic control unit (ECU) such as an engine control module (ECM), where usage of varying adapters with generic ECUs or parts of ECUs provides scalability across various applications.

BACKGROUND

Engine management is becoming increasingly dependent on complex electronics and is no longer solely reliant on mechanical devices such as hydraulic control mechanisms. With the expansion of electronics-based control, manufacturers frequently develop uniquely tailored or derivative ECUs in order to accommodate various changing demands for ECU functionality.

Manufacturers commonly experience obsolescence challenges with existing legacy ECUs, which may be developed in families or product suites. Developing cost effective replacement ECUs is constrained by each ECU family having unique mounting connectors and pin-outs, which impose distinct form and fit requirements. ECUs generally include one or more microcontrollers or microprocessors, a driver circuit, and connectors. These components are typically all mounted on a printed circuit board (PCB) and disposed in a housing.

SUMMARY

One embodiment is related to an engine control systems, which includes an integrated electronic control unit assembly having an ECU with one or more adapter-connectors. The one or more adapter-connectors includes a rigid or flexible PCB with routing elements with/without electronic components, an ECU-side connector, an engine-side connector, and a hermetic enclosure. The ECU further includes a rigid or flexible PCB with routing elements and/or electronic components, one or more connectors, and a hermetic enclosure. The ECU may be manufactured such that the one or more adapter-connectors are integrated to it. Further, one or more connectors of the ECU are adapter-connectors. Additionally, the ECU-side connector of one or more adapter-connectors is configured to mate with the PCB of the ECU. Further, an engine-side connector of one or more adapter-connectors is configured to mate with engine hardware, and is hermetic after mating. An integrated electronic control unit assembly is configured in such a manner that one or more adapter-connectors is an integral part of the ECU.

In another embodiment, an engine control systems includes an integrated electronic control unit assembly having an ECU and one or more adapter-connectors. The one or more adapter-connectors further includes a rigid or flexible PCB with routing elements and/or electronic components, an ECU-side connector or receptacle, an engine-side connector, and a hermetic enclosure. The ECU further includes a rigid or flexible PCB with routing elements and/or electronic components, one or more connectors, and a hermetic enclosure. Further, the ECU-side connector of one or more adapter-connectors is configured to mate with an existing connector of the ECU and is hermetic after mating. Additionally, the engine-side connector of adapter-connector is configured to mate with engine hardware, and is hermetic after mating.

In such an embodiment, one or more of the connectors of the ECU may be configured to connect directly to engine hardware, or none of the connectors may be so configured. Further, one or more of the connectors of the ECU may be configured to mate with one or more adapter-connectors, or, alternatively, none of the connectors of the ECU may be so configured. An integrated electronic control unit assembly is configured in such a manner that mating of the one or more adapter-connectors and the ECU is in between the connectors of both, and hermetic enclosures of the adapter-connectors and the ECU may or may not be in contact. The hermetic enclosures are configured to protect the ECU and the adapter-connectors, respectively, from environmental conditions. In such an embodiment, the adapter-connector is added to an existing ECU to provide scalability across different applications.

Yet another embodiment relates to a system having an ECU and one or more adapter-modules. The one or more adapter-modules further include a rigid or flexible PCB with routing elements and/or electronic components, an ECU-side connector or receptacle, an application-side connector, and a hermetic enclosure. Further, the ECU-side connector or receptacle is configured to mate with the ECU and is hermetic after mating. Further still, the application-side connector is configured to mate with engine hardware, and is hermetic after mating. The ECU further includes a rigid or flexible PCB with routing elements and/or electronic components, one or more connectors, and a hermetic enclosure. Further, one or more of the connectors of the ECU are configured to connect directly to engine hardware, and one or more of the connectors of the ECU are configured to mate with the adapter-modules. Alternatively, none of the connectors of the ECU may be configured to connect directly to engine hardware, and/or none of the connectors are configured to mate with the adapter-modules. The integrated electronic control unit assembly is configured in such a manner that mating of the adapter-modules and the ECU is in between the connectors of both, and hermetic enclosures of each may or may not be in contact. The hermetic enclosures are configured to protect the ECU and the adapter-modules, respectively, from environmental conditions. The ECU includes a microcontroller and the PCB of the ECU includes routing elements arranged such that signals from the microcontroller are directed to connection points of the connector of the ECU and another electronic component or components.

Yet another embodiment relates to a method of internally configuring and integrating an application-specific printed circuit board and a generic printed circuit board of an ECU. The method includes providing a facilitator configured to connect to the first component and a second component. The method further includes disposing the facilitator between the first component and the second component, and communicating the first component and the second component via the facilitator. The first component is a generic printed circuit board and the second component is the application-specific printed circuit board. The facilitator may comprise an interconnect including, for example, an integrated pre-routed printed circuit board. The facilitator may comprise various components as described in the apparatuses summarized herein.

These and other features will become apparent from the following detailed description when taken in conjunction with the accompanying drawings described in the brief description below.

BRIEF DESCRIPTION OF THE FIGURES

FIGS. 5A, 5B, 5C, 5D, 5E and 5F are depictions of various internal configurations for an ECU according to alternative embodiments.

DETAILED DESCRIPTION

Figure 1:
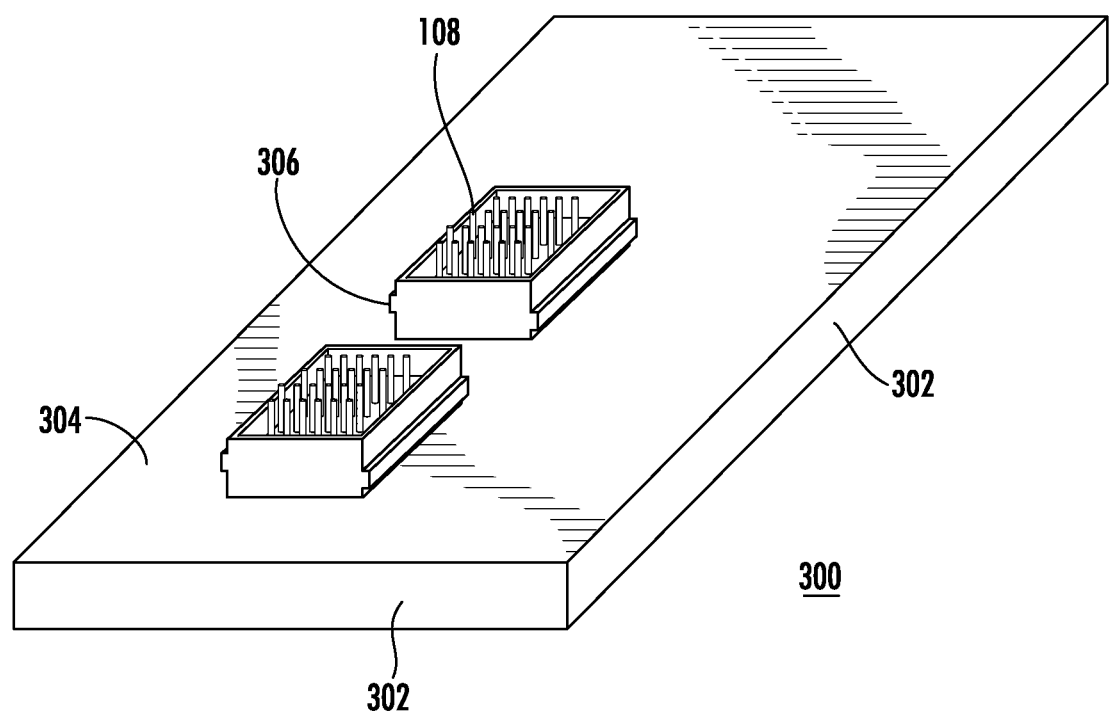
FIG. 1 is a perspective view of an ECU, with one or more connectors, according to an embodiment.

Referring to the figures generally, the various embodiments disclosed herein relate to systems and apparatuses including adapters for ECUs.

As mentioned above, typical approaches involve manufacturing unique or derivative ECUs to accommodate various applications. Manufacturing unique or derivative ECUs results in new PCBs being required for each unique application. This leads to additional ECU part numbers and reduced product volume for any one version of an ECU. Further, manufacturing such ECUs also engenders having multiple products to support through across their lifetimes, and contributes to generally higher piece part costs and higher Non-Recurring Engineering (NRE) costs because the cost of each ECU is split across fewer modules.

According to various embodiments described herein, various adapters may be used with a generic ECU or parts of a generic ECU so as to provide scalability across various applications. Enhancing scalability helps to control part number proliferation, increase product volumes, lower piece part cost and lower NRE costs. In one embodiment, an adapter, a base module comprising an ECU and an application specific adapter-connector are provided together, so as to achieve multiple control applications. The base module contains a common PCB which communicates with an ECU microcontroller or microprocessor, driver circuits and other required functionality. The adapter-connector re-routes the signals from the base module to a connection system particular to an application. Such an approach allows for the ECU to be readily upgradable, replaceable and backward compatible. Moreover, such an approach achieves scalable and flexible packaging of the ECU to facilitate serving a plurality of applications via a common PCB.

Further, the various embodiments described herein facilitate replacement of existing ECUs while maintaining existing connector systems, module footprints and module mounting features. In particular, a common highly capable PCB is disposed within a common enclosure with a generic connector, and another application specific adapter-module is provided which can be connected using the generic connector. Moreover, the adapter-module re-routes signals from the generic connector to the application specific connectors in a rugged and durable mechanical enclosure. The adapter module contains a pre-routed PCB with/without electronic components and space for application specific connectors and generic connectors, as described in further detail below.

Further still, in another embodiment, including an adapter for an internal configuration for an ECU, an application-specific pre-routed PCB is integrated with a common highly capable PCB disposed within a common enclosure using a facilitator. The application specific connector may be attached to an application-specific PCB, which effectively results in an application specific ECU. Such an embodiment allows mass production of a common highly capable PCB with a common housing.

Additionally, an embodiment relates to an engine control system, which include an integrated electronic control unit assembly having an ECU with one or more adapter-connectors. The one or more adapter-connectors further includes a rigid or flexible PCB with routing elements with or without electronic components, an ECU-side connector, an engine-side connector, and a hermetic enclosure. The ECU further includes a rigid or flexible PCB with routing elements and/or electronic components, one or more connectors, and a hermetic enclosure. The ECU may be manufactured such that the one or more adapter-connectors are integrated to the ECU. Further, one or more connectors of the ECU are adapter-connectors. Additionally, the, ECU-side connector of one or more adapter-connectors is configured to mate with a PCB of an ECU. Further, an engine-side connector of one or more adapter-connectors is configured to mate with engine hardware, and is hermetic after mating. An integrated electronic control unit assembly is configured in such a manner that one or more adapter-connectors are an integral part of the ECU. In such embodiments, removal of the adapter-connector from the ECU may result in major or total loss of functionality.

Turning now to FIG. 1, a perspective view of an embodiment including an ECU with one or more connectors is shown. An ECU 300 is provided with two connector arrangements 108. The ECU 300 includes a PCB 101 (shown in FIG. 2A). The connectors 108 include a pin connector arrangement 108 extending parallel to enclosure walls 306 surrounding the connectors 108. The pin connector arrangement 108 may connect to engine hardware for an internal combustion engine, for example. The controller of the ECU 300 may permit regulation of at least one engine characteristic of the internal combustion engine. The enclosure walls 306, shown also in FIGS. 3A and 3B, project from an enclosure top surface 304 of a rectilinear enclosure bounded by sides 302. In some implementations, the enclosure sides 302 may define a curvilinear or partially curvilinear enclosure rather than a rectilinear one.

Figure 2A:
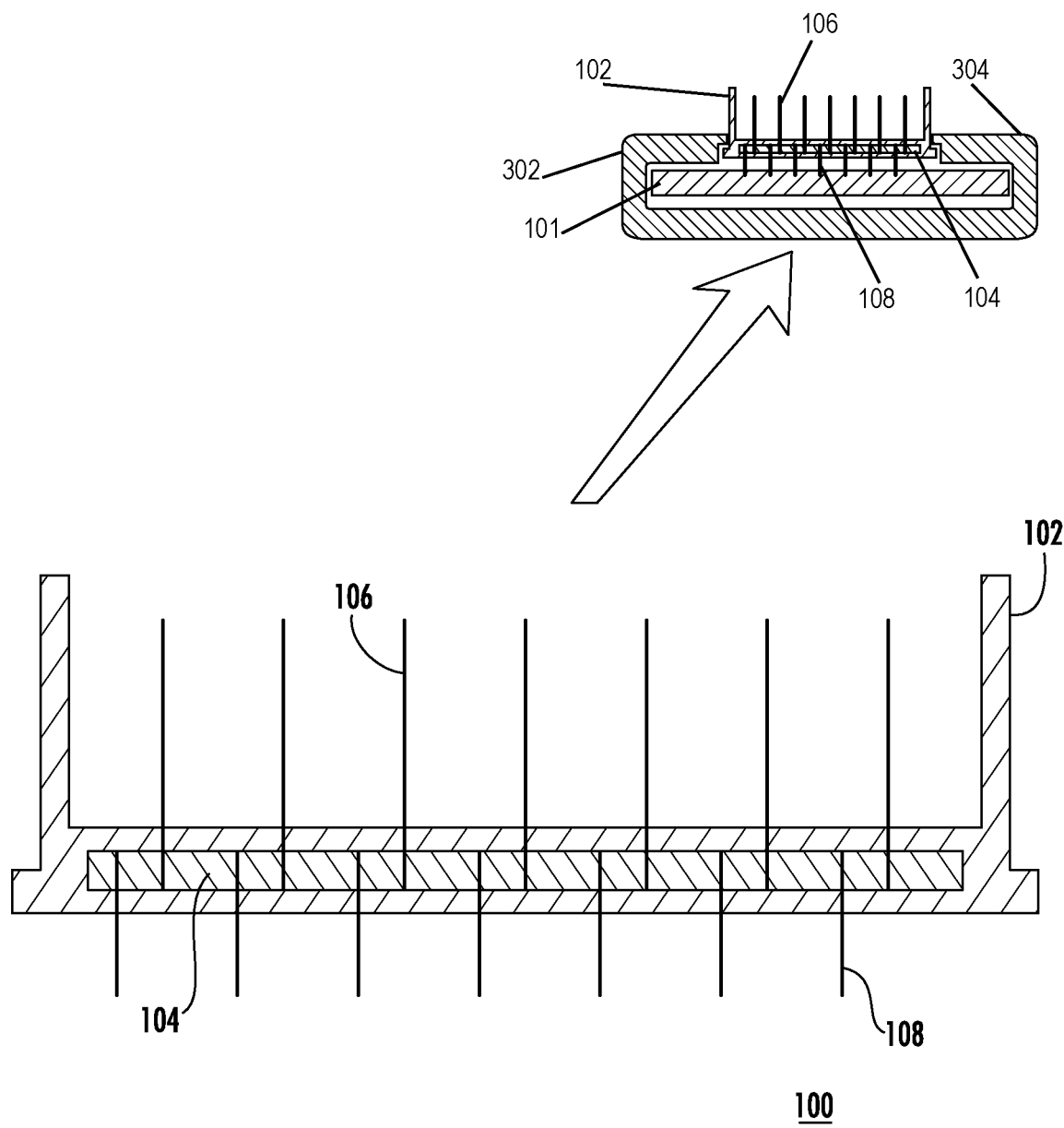
FIG. 2A is a depiction of an adapter-connector, according to an embodiment.

Turning now to FIG. 2A, an adapter-connector according to an embodiment is depicted. An integrated electronic control unit assembly has an ECU with one or more adapter-connectors 100. The one or more adapter-connectors 100 includes a rigid or flexible PCB 104 with routing elements with/without electronic components, an ECU-side connector 108, an engine-side connector 106, and a hermetic enclosure 102. The ECU further includes a rigid or flexible PCB 101 with routing elements and/or electronic components, one or more connectors, and a hermetic enclosure having sides 302. The ECU may be manufactured such that the one or more adapter-connectors are integrated to it. Further, one or more connectors of the ECU are adapter-connectors. Additionally, the, ECU-side connector of one or more adapter-connectors is configured to mate with the PCB 101 of the ECU. Further, an engine-side connector of one or more adapter-connectors is configured to mate with engine hardware, and is hermetic after mating. The integrated electronic control unit assembly 100 is configured in such a manner that one or more adapter-connectors are an integral part of the ECU.

The PCB 104 may be pre-routed and is disposed between pins of engine-side connector 106, which is an application-specific pin connector arrangement 106 and pins of ECU-side connector 108, which is a generic pin connector arrangement. Signals from a microcontroller (not shown) and drivers on the PCB 101 are routed toward generic pin connector arrangement 108 where the connector is attached. The pre-routed PCB 104 may be a rigid FR-4 board or a flexible board, and h is protected by the enclosure 102.

The pre-routed PCB 104 takes signals from the main PCB 101 on the generic pin arrangement side of the connector (where the pins of the generic pin connector arrangement 108 are located) and re-routes the signals to a desired location on the application specific arrangement side of the connector (where the pins of the application-specific pin connector arrangement 106) are located. Varying numbers and arrangements of pins may be provided on the bottom of the connector (e.g., the board side or the generic pin arrangement side where pins of the generic pin connector arrangement 108 are) and/or the top side of the connector (e.g., the harness side or the application specific pin arrangement side where pins of the application-specific pin connector arrangement 106 are). The adapter-connector may be soldered to the PCB 101 of the ECU, such that the ECU and the adapter-connector are combined into a single entity.

In at least one implementation, an integrated ECU assembly contains a 60-way connector in which four signals come from the circuit (for example, onto pin numbers 3, 8, 22 and 45) on the connector, and another module which requires a 90-way connector with four signals (e.g., at pins 4, 6, 10 and 70). A common PCB with 90-way generic holes is provided, in which a 90-way connector is connected at the bottom side (the generic pin arrangement side), and a 60-way connector is connected at the top side (the application specific pin arrangement side) to serve a first application.

Figure 2B:
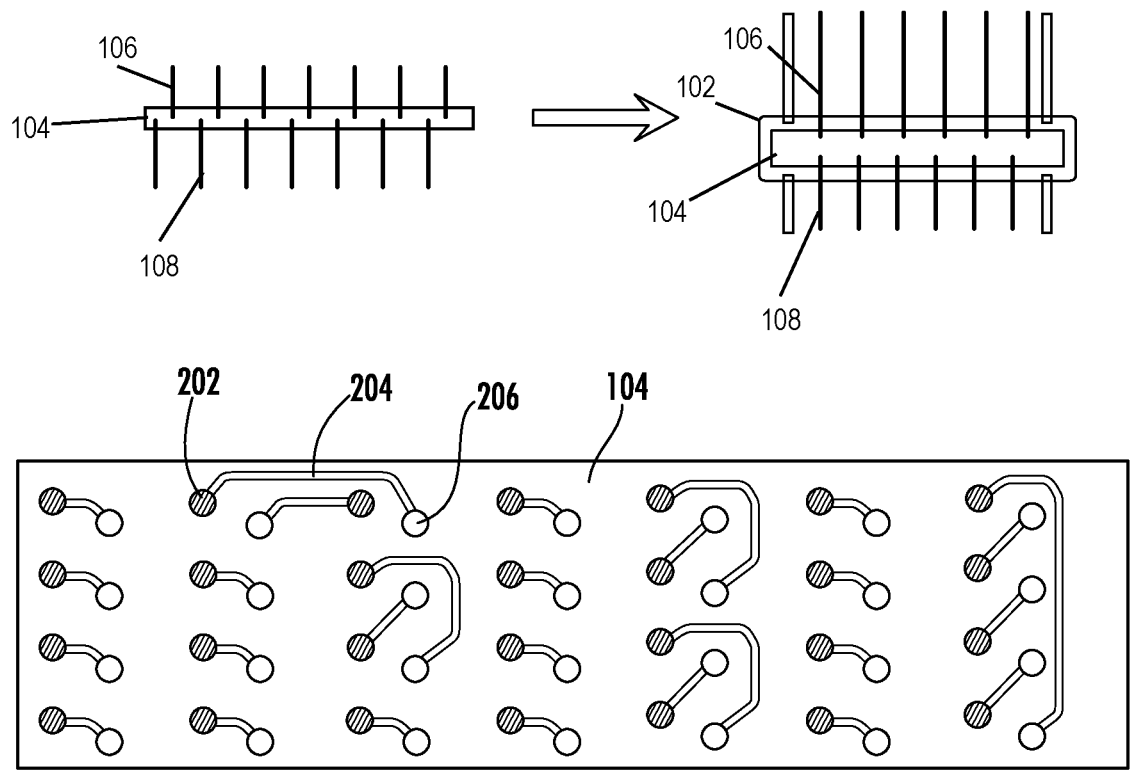
FIG. 2B is a depiction of a PCB used within an adapter-connector, according to an embodiment.

FIG. 2B shows a PCB 104 as placed inside the adapter-connector of FIG. 2A. In the PCB 204, pins are attached facing upward and downwards, and the resulting assembly is placed and encapsulated in a hermetic enclosure, thereby forming an assembled adapter-connector. As shown in FIG. 2B, the PCB 104 includes traces 204 between the ends 202 of pins of the generic pin connector arrangement 108 on the generic pin arrangement side and the ends 206 of pins of the application-specific pin connector arrangement 106 on the application-specific pin arrangement side. The 90 pins on the top side (the application specific pin arrangement side) are provided to serve a second application. Using the pre-routed PCB 104 (or a flexible circuit), the four signal lines may be brought from the PCB to an application-specific location on the connector's top side. In this manner, the same board may be used to serve two different applications by modifying the connection scheme.

As illustrated in FIGS. 2A and 2B, for example, pre-routed circuit boards such as PCB 104 may be used. Pre-routed circuit boards are generally very inexpensive, but may increase connector height by several millimeters when used inside the connector. If such a height increase is infeasible, then a flexible circuit may be used in place of a pre-routed circuit board. The flexible circuit does not increase overall height. Further, it should be noted that the pins of the application-specific pin connector arrangement 106 on the top side (the harness side) may differ in any or all of pitch, dimension and orientation from the bottom side (the board side) pins of the generic pin connector arrangement 108.

Figure 3A:
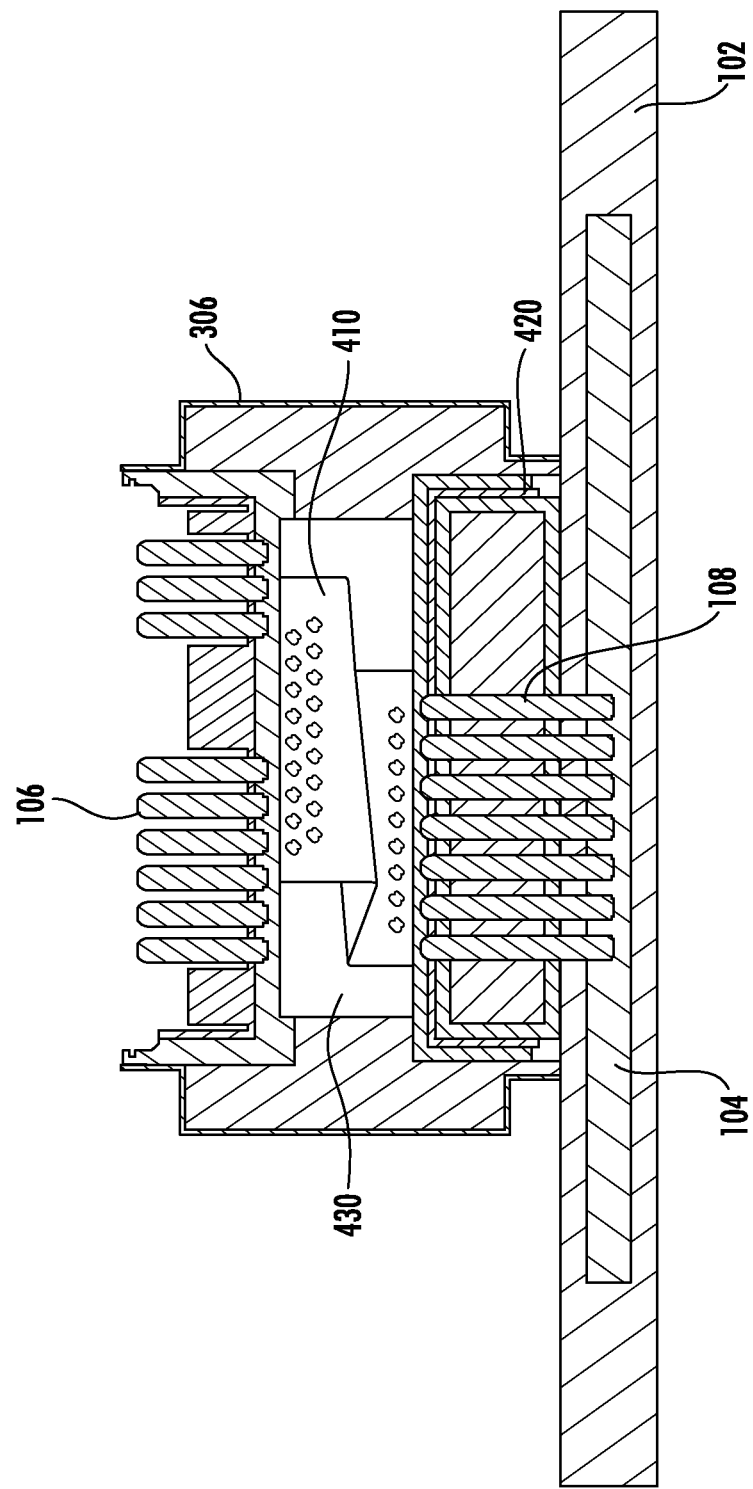
FIG. 3A is a depiction of an assembly of an ECU with an adapter-connector, according to an embodiment.
Figure 3B:
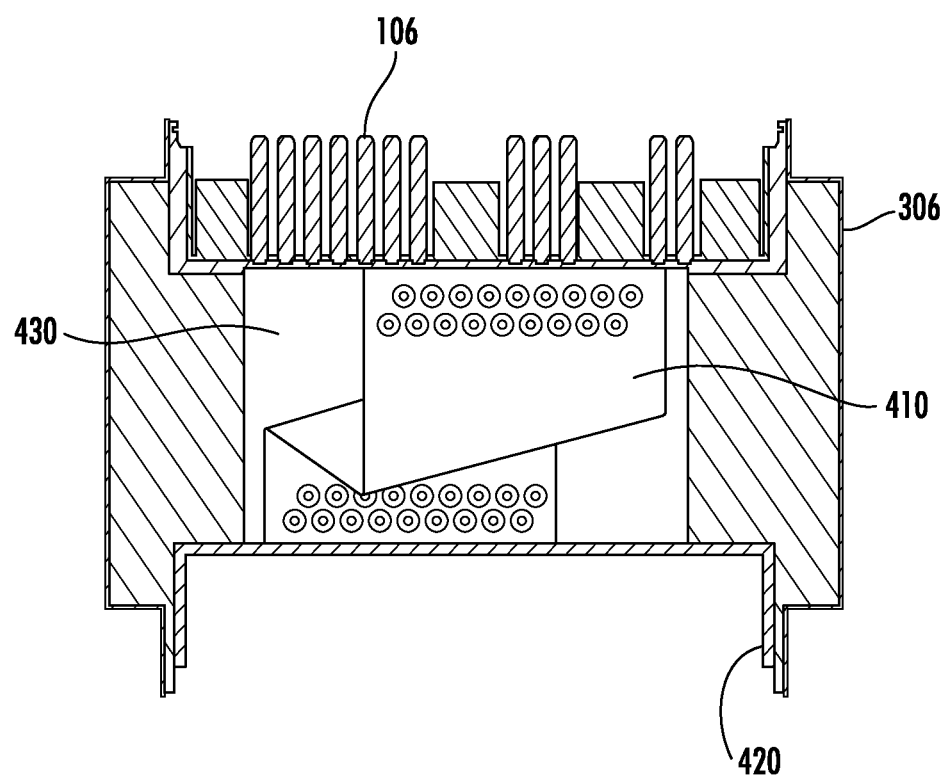
FIG. 3B is a depiction of the adapter-connector according to the embodiment shown in FIG. 3A, including a flexible circuit.

Referring now to FIGS. 3A and 3B, an adapter-connector attached externally to an ECU according to an embodiment is depicted. An integrated electronic control unit assembly includes the ECU and one or more adapter-connectors. The one or more adapter-connectors further includes a rigid or flexible PCB 104 with routing elements and/or electronic components, an ECU-side connector or receptacle 108, an engine-side connector 106, and a hermetic enclosure. The ECU further includes a rigid or flexible PCB with routing elements and/or electronic components, one or more connectors, and a hermetic enclosure. Further, the ECU-side connector of one or more adapter-connectors is configured to mate with an existing connector of the ECU and is hermetic after mating. Additionally, the engine-side connector of the adapter-connector is configured to mate with engine hardware, and is hermetic after mating.

In particular, a portion of a system is shown including an ECU comprising a common PCB in a lower enclosure portion 102. The lower enclosure portion 102 contacts an upper enclosure portion 420. A flexible connector 410 is provided in an interior space 430 of an upper enclosure portion 420. The flexible connector 410 connects to the application-specific pin connector arrangement 106 on an application specific pin arrangement side, as shown in FIG. 3B. The flexible connector 410 also connects to a generic pin connector arrangement 108 on a generic pin connector arrangement side, as shown in FIGS. 3A and 3B. The connector 410 comprises at least one flexible circuit. The PCB 104 and/or the PCB 101 of the ECU as shown in FIG. 2A may comprise at least one microcontroller. The assembly shown in FIG. 3B is configured to be mounted atop the ECU 300 shown in FIG. 1, for example.

Figure 4A:
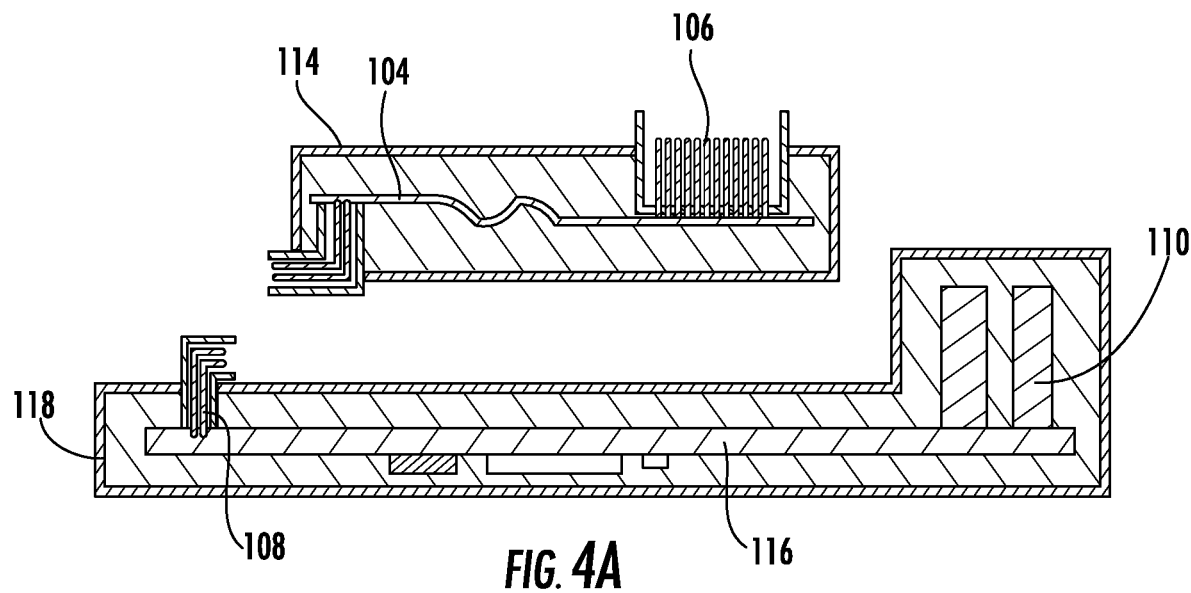
FIG. 4A is a depiction of a module assembly according to an embodiment.

Turning now to FIG. 4A, an adapter module and a generic connector assembly are depicted. An adapter module is provided within a housing 114 and comprises the flexible or rigid PCB 104, along with an application specific connector (e.g., application-specific pin connector arrangement 106). The pins of the application-specific pin connector arrangement 106 mate horizontally with generic pin connector arrangement 108 provided for a PCB 116 in an ECU disposed beneath the PCB 104 and enclosed within a housing 118. The generic pin connector arrangement 108 and the application-specific pin connector arrangement 106 may have differing or equal numbers of pins.

Referring again to FIG. 4A, the ECU includes components 110 which may be relatively tall and which may also be critical components provided with cooling mechanisms such as heat sinks. The housings 114, 118 accommodate the components 110. As shown on the left side of FIG. 4A, pins from PCB 104 are disposed so as to align vertically with pins of the generic pin connector arrangement 108 extending from PCB 116. Thus, first connectors connected to PCB 104 and second connectors connected to PCB 116 are configured to be adjacent to each other when mated.

Figure 4B:
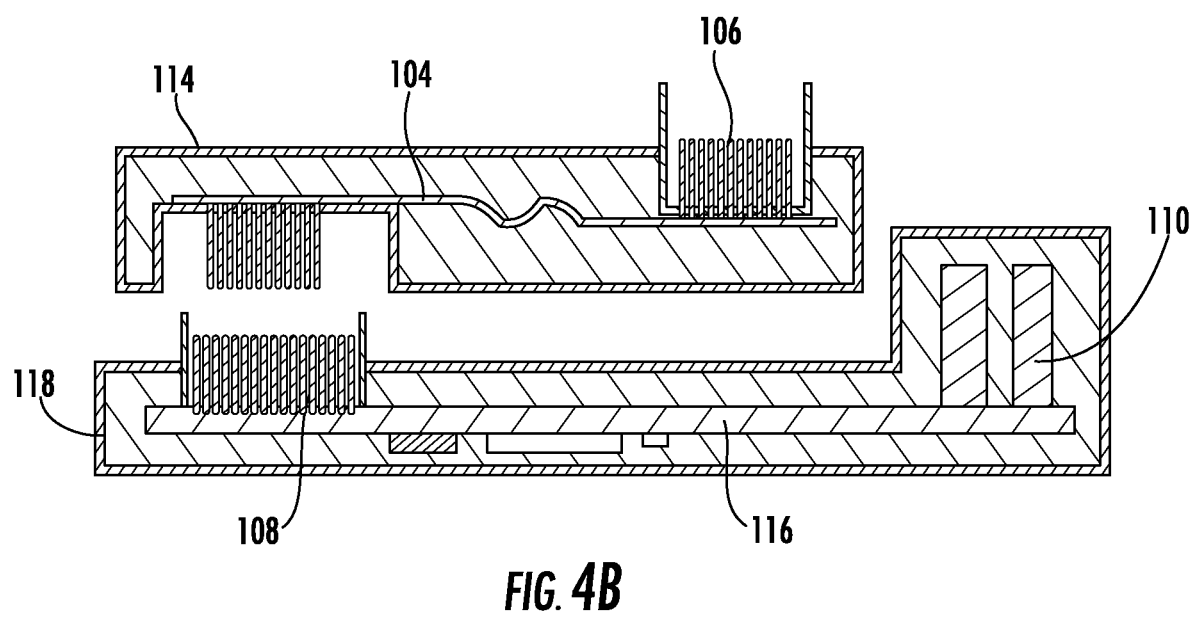
FIG. 4B is a depiction of a module assembly according to an embodiment.

FIG. 4B includes a flexible or rigid FR-4 PCB 104, application-specific pin connector arrangement 106, generic pin connector arrangement 108, a common PCB 116, housings 114, 118 and components 110. However, in the configuration of FIG. 4B, pins of the generic pin connector arrangement 108 which is connected to PCB 104 are arranged to mate vertically with pins of the application-specific pin connector arrangement 106, which is connected to PCB 116. As shown on the left side of FIG. 4B, at least some of pins from PCB 104 are disposed below PCB 104 and are above pins of the generic pin connector arrangement 108 extending from PCB 116. Thus, second connectors connected to PCB 116 are configured to be disposed beneath first connectors connected to PCB 104 when mated.

Accordingly, the ECU in the housing 118 and the highly capable PCB 104 in the housing 114 may be arranged in a variety of configurations and are not limited to a vertical stack fashion. In particular, the housing 118 may be arranged to conform to a vertical profile and/or a horizontal profile of an integrated engine control module assembly. Furthermore, although FIGS. 4A-4B each depict two PCBs, some implementations feature a third PCB (not shown). The third PCB may contain a preconfigured routing arrangement. In certain implementations, at least one of a flexible circuit and the third PCB is configured to re-route signals from a first PCB (e.g., PCB 104) to a second PCB (e.g., PCB 116).

Referring again to FIGS. 4A-4B, the housing 118 encasing the ECU comprising PCB 116 may be a hermetic enclosure configured to protect the PCB 116 from various environmental conditions. The housing 118 comprises at least one ruggedized member configured to protect at least the PCB 116. The housing 118 may be a single piece or a multi-piece assembly. The housing 118 is configured to withstand ranges of pressures typically encountered in automotive environments, and, more particularly, in engine environments. Additionally, the housing 118 is substantially dust-resistant and waterproof (for example, in accordance with r Ingress Protection Standards IP-69 and IP-69K as set forth pursuant to DIN 40050-9) and configured to be operable at temperatures typical for automotive operation and in harsh environments, e.g., between about −40° C. and about 105° C. Furthermore, the housing 118 is configured to dissipate heat from signal processing circuitry on PCB 116, which signal processing circuitry may be also operable between −40° C. and 105° C., for example.

Furthermore, the housing 118 is structured so as to protect components housed therein from vibration. In particular, a position of the ECU may be defined along x-, y-, and z-axes. The assemblies shown in FIGS. 4A-4B are subject to vibrations along these axes. Such vibrations may be especially severe for particular vehicle applications or in particularly harsh environments. To help insulate sensitive electronic components from vibrations, the housing 118 is configured to withstand a high vibration automotive environment. For example, the housing 118 may be configured to withstand vibrations of 15 to about 20 G, or more than about 20 G, along all three axes.

In addition, the housing 118 is chemically resistant so as to withstand exposure to a variety of substances. In particular, the housing 118 is resistant to non-polar solvents, polar solvents, diesel fuel, motor oil, gas, brake fluid, engine oil, coolant, antifreeze, coffee, carbonated beverages, detergents, degreasers, grease and battery acid. The housing 188 of the may be made of metals, automotive grade plastics, or combinations thereof, so as to achieve appropriate structural strength.

Further, the housing 118 is substantially dust-resistant and waterproof so as to offer substantially complete protection against contact, in accordance with Ingress Protection Code (IP Code) standards (e.g., to achieve IP 69K ratings). The housing 118 is configured to withstand bombardment from gravel at high pressure. The housing 118 may be formed of a variety of materials, e.g., aluminum, aluminum alloy, other metals, e.g., other automotive grade cast alloys, plastics, or any combination thereof. Additionally, in such embodiments, the housing 118 protects against liquid ingress when immersed in at least 1 m of liquid at a specified temperature and pressure. The housing 118 is further configured to be break-resistant when drop-tested by dropping from a height of 1 m onto concrete. Moreover, the housing 118 is resistant to humid environments and are configured to operate normally in environments of 95% humidity or less. Further, in some embodiments, the housing 118 is configured to withstand pressure washing so as to be leak-resistant even under high pressure washes of about 1500 psi or more, with elevated water temperatures of 90° C. and in close proximity to a pressure washer nozzle.

FIGS. 5A-F are depictions of various internal configurations for an ECU according to alternative embodiments. As apparent from the foregoing, the disclosed exemplary embodiments encompass a variety of adapter configurations. FIG. 5A depicts a rigid PCB configuration in which a rigid adapting member 912 is connected via solder joints 904 to a header connector 914. The rigid adapting member 912 is further connected via solder joints 904 to a facilitator 906 having an interconnect body 910. The facilitator 906 has solder joints 904 disposed on top and bottom sides of the interconnect body 910. The solder joints 904 on the top side are configured to connect to the rigid adapting member 9120, while the solder joints 904 on the bottom connect to a mother board 916.

FIG. 5C depicts another rigid PCB configuration in which a rigid adapting piece 912 is connected via solder joints 904 to a facilitator 906 having an interconnect body 910 with solder joints on top and bottom sides thereof. Additional solder joints 904 connect the facilitator 906 to the motherboard 916. The motherboard 916 is in turn connected to the header connector 914.

FIG. 5E depicts yet another rigid PCB configuration in which the rigid adapting piece 912 is connected via solder joints 904 to a facilitator 906. The solder joints 904 of the facilitator 906 connect to the motherboard 916. The motherboard 916 is in turn connected to the header connector 914.

FIG. 5B depicts a flexible PCB configuration in which a flexible adapting piece 918 is connected via solder joints 904 to a header connector 914. Additional solder joints 904 connect the flexible adapting member 918 to a connector 922 of a facilitator 906. The facilitator 906 includes further solder joints 904 which connect the facilitator 906 to the motherboard 916.

FIG. 5D depicts another flexible PCB configuration in which the flexible adapting piece 918 is connected to solder joints 904 of a facilitator 906. The facilitator 906 is in turn connected by its solder joints to the header connector 914. The flexible adapting member 918 is connected to another facilitator 906. The another facilitator 906 includes further solder joints 904 which connect the another facilitator 906 to the motherboard 916.

FIG. 5F depicts hybrid configurations including both rigid and flexible members, and multiple facilitators 906. A first hybrid configuration, shown on the left of FIG. 5F, includes the flexible adapting piece 918 connected to a first facilitator 906 having a first connector 922. The first facilitator 906 is in turn connected by solder joints 904 to the motherboard 916. The flexible adapting member 918 is connected to another facilitator 906 having another connector 922. The connector 922 includes solder joints 904 which connect to a rigid board 926. The rigid board 926 is in turn connected to the header connector 914. A second hybrid configuration, shown on the right of FIG. 5F, likewise includes rigid and flexible components. In particular, a motherboard 916 is connected to a first facilitator 906. The first facilitator 906 includes solder joints 904 interposed between the motherboard 916 and the connector 922. The connector 922 is connected to a flexible PCB 924, which is also connected to another connector 922 that is interposed between the flexible PCB 924 and the rigid adapting member 912. Further still, additional solder joints 904 connect the rigid adapter member 912 to the header connector 914.

The embodiments described herein adapt ECUs to include additional or alternative components (e.g., connectors, PCBs, daughter cards, and various combinations thereof). In this manner, the adaptive techniques described herein allow for replacement modules for legacy modules that are experiencing obsolescence problems. For example, a generic ECU with an adapter module on top may replace a first ECU, while the same generic ECU with a different adapter module may replace a second ECU. Table 1, below, describes various configurations with reference to the embodiments shown in FIGS. 5-7 and described above.

TABLE 1

| Configurations | Location of adapted component | Assembly of adapter | Implementations |
|---|---|---|---|
| Adapter Connector (Integrated to ECU) | Integrated with ECU's PCB. Connector is soldered or press-fitted into the PCB. | Built separately from ECU, however, is attached in stages of ECU manufacturing. | Adapter connector can have rigid or flexible PCB inside it. Pins can be soldered or press-fitted into the PCB. Will contain a seal in the open-bay of the connector to protect from dust, water & chemicals. |
| Adapter Connector (External to ECU) | External to ECU Adapter connector on top or side of the generic ECU connector (for example, a relatively small adapter placed on a generic connector for conversion to an application specific connector, akin to a travelling pin converter or jumper harness) | Built separately from a generic ECU Attached to generic ECU post-production | Adapter connector containing flexible circuit Adapter connector with rigid board inside Adapter connector with rigid-flex connection Pins in connector (e.g, for a header-receptacle with one side header, one side receptacle), or header-header. Will contain a seal in the open-bay of the connector to protect from dust, water & chemicals. |
| Internal Configurations | Internal to ECU Re-routing of signals for adaptation takes place in either the flexible portion or in the portion which connects to application specific connector (FIG. 6) Re-routing of signals for adaptation happens in the daughter board, which is placed onto the motherboard (highly capable PCB) itself, and the application specific connector directly fits on motherboard (FIG. 7) | Built separately from the generic ECU's motherboard (highly capable PCB) Placed during final assembly of PCB, housing and other components Placed during build of PCB Integral piece of motherboard (like a flex-rigid PCB, with rigid and non-rigid portions) | (FIG. 6) Motherboard connected with flex cable, by direct soldering of flexible cable onto motherboard, or connected with flex cable, by a connector Flex cable directly soldered onto the header connector Flex cable includes a soldered rigid end portion underneath the connector Fasteners (e.g., screws) Short flex cable to transport signals from motherboard toward connector, and second FR-4 portion to re-route signals Board-board connector Connector with straight, compliant or vibration-reducing pins and optional pin housing (FIG. 7) Daughter board may be made of rigid FR-4 or flexible circuit, and include multiple components |
| Adapter Module | External module (on top or side of generic ECU) Generic module is mated with ruggedized adapter module | Built separately from the generic ECU Post-production attachment to a generic ECU | Mating horizontal or vertical direction Small or large footprint Metal alloys and/or plastics |

Figure 6:
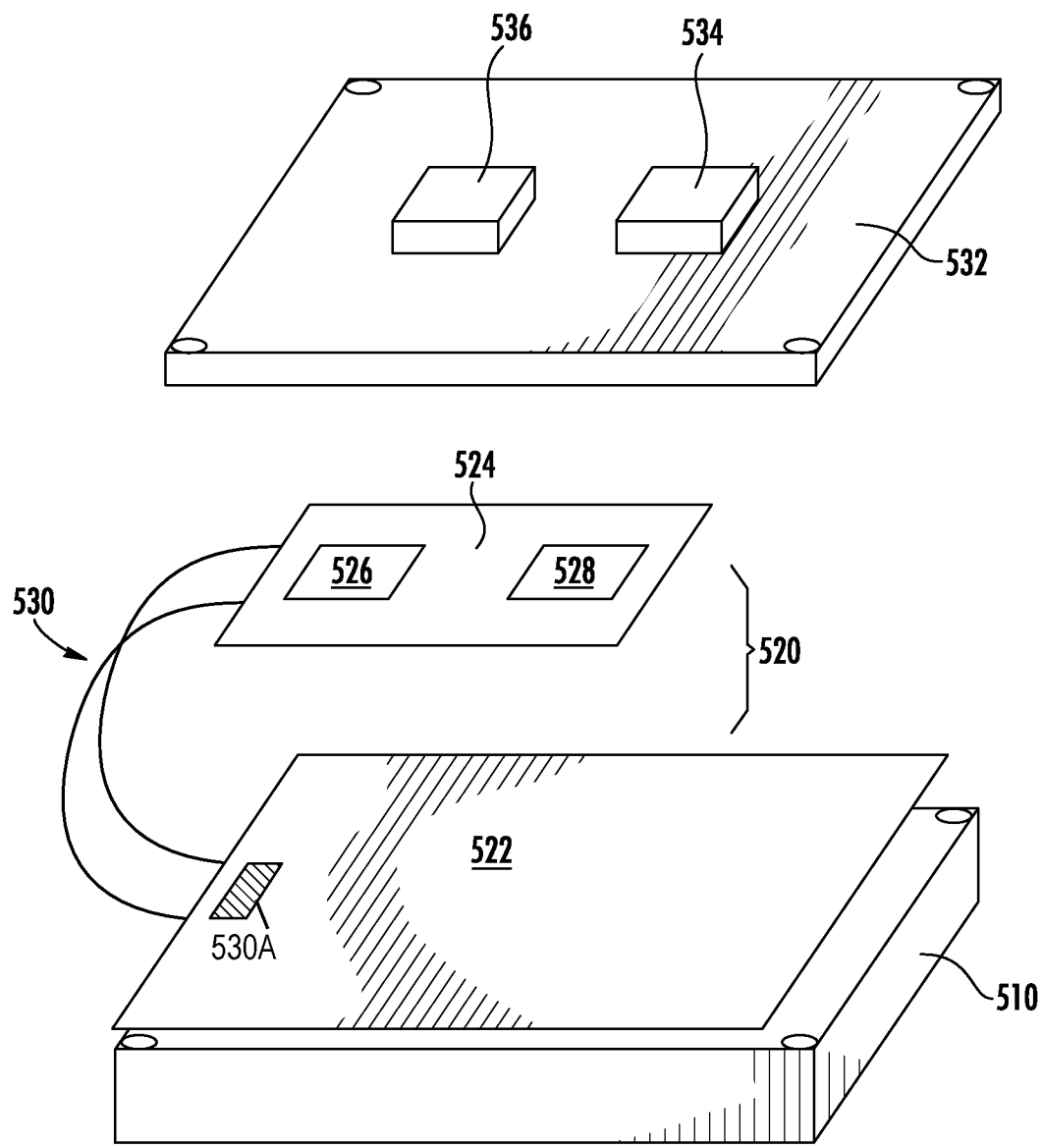
FIG. 6 is a depiction of a facilitator assembly according to a configuration of an embodiment as shown in FIG. 5.

Turning now to FIG. 6, a connection assembly 500 is depicted which includes a highly capable common PCB 522. The common PCB 522 uses a unique circuit board 520. The daughter board 520 receives signals coming from a controller or processor (or driver circuits) and re-routes them according to a pin connection scheme required for a specific application. For example, the daughter board 520 may receive signals from a controller or processor which is configured to regulate at least one engine characteristic. A connector 530 may be attached to the daughter board 520 and at least partially contained or protected by an enclosure 510, and configured to attach to connector 530A of the board 522.

Referring again to FIG. 6, the daughter board 520 may be connected to the common PCB 522 using through-hole soldering. The daughter board 520 is protected by an ECU cover 532 having component accommodation sites 534, 536. The ECU cover 532 may be tailored to a specific application to accommodate a particular combination of connectors, mounting features and size requirements. The ECU cover 532 and/or the enclosure 510 may be adapted to a particular mounting hole configuration.

By way of illustration, the daughter board 520 may be employed for a connection assembly in which a 40-way connector is provided. Certain signals are transmitted at pins 8, 9, 10 and 37, for example, at connection sites 526, 528 on a top layer 524 of the daughter board 520. The top layer 524 comprises integrated mounting points and a connection system configured to communicate with at least a second PCB. In other configurations, the same signals are transmitted at pins 3, 6, 10 and 40. The daughter board 520 re-routes the signals as required between the common PCB 522 and the connector.

In certain embodiments, the common PCB 522 may be connected with a flexible cable to the daughter board 520. The flexible cable may be directly soldered to the PCB 522 or connected via a connector. Further, a flexible cable may be directly soldered onto a header connector of the PCB 522. In some implementations, a flexible cable may be used which includes a rigid FR-4 end portion that is positioned underneath a connector and is soldered to the PCB 522. The flexible cable may be a relatively short cable that permits transmission of signals from the PCB to the connector, and may be provided in conjunction with a second rigid FR-4 portion that re-routes the signals. Alternatively, the flexible cable may be replaced by a board-to-board connector so that the boards may be connected while stacked on top of each other. The lower board may be a highly cable PCB that outputs signals which are transferred to the connector and re-routed in the upper PCB.

Further still, in certain alternative embodiments, mechanical fastening devices may be used to affix components such as the boards 520, 522. For example, screws may be provided to ensure a secure connection. The connector (e.g., connector 530) may optionally use screws or have a body component around its pins. In other words, the pins may be provided with a surrounding component for additional protection. The pins of the connector may be straight pins, compliant pins or may be shaped in a manner which contributes to vibration reduction.

Figure 7:
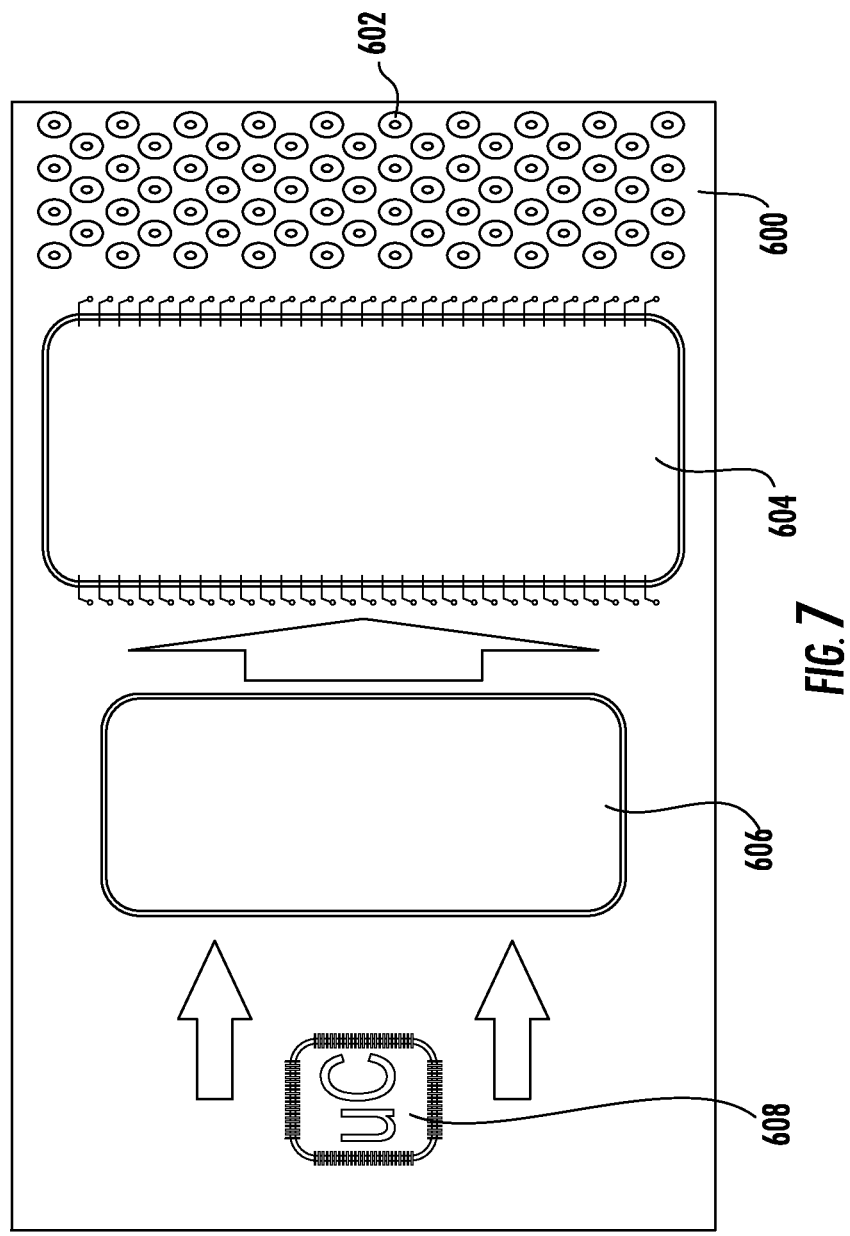
FIG. 7 is a depiction of a facilitator assembly according to a configuration of an embodiment as shown in FIG. 5.

Referring now to FIG. 7, an interconnect assembly 600 is depicted. The assembly shown in FIG. 6 is an internal configuration constructed such that signals may be transmitted on a first side of the PCB 604 to a desired location on a second side.

The assembly 600 includes a daughter board PCB 604. The daughter board PCB 604 may include a rigid FR-4 component or a flexible circuit. In contrast to the assembly 500 shown in FIG. 5, the assembly 600 is specifically constructed such that re-routing of signals occurs on the daughter board PCB 604. PCB 604 includes routing elements arranged such that signals from a microcontroller 608 are directed to various connection points on the PCB so as to communicate with connectors located at holes 602. The PCB 604 contains traces which route signals from pins on a left side to the holes 602 on a right side, where specific connectors for at least one module may be located. More particularly, traces from the microcontroller 608 connect the microcontroller 608 to connectors 606. The connectors 606 may comprise analog connectors, high side drivers, low side drivers, battery connections, sensor connections, or any combination thereof. Additional traces are provided between the connectors 606 to the PCB 604.

Figure 8:
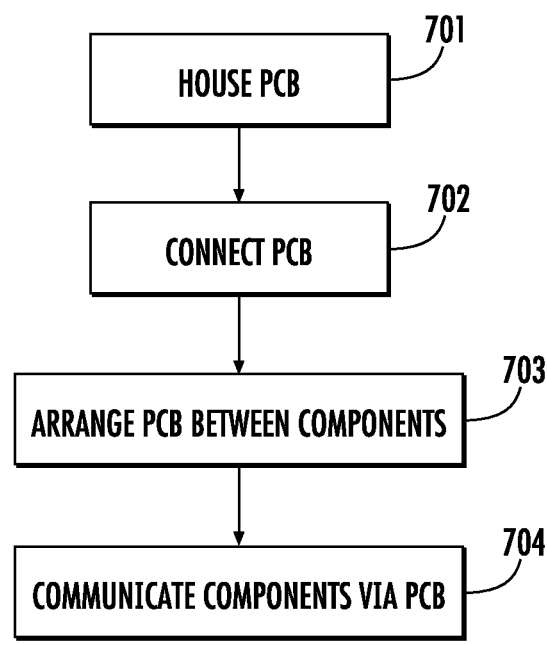
FIG. 8 is a flow diagram of a connection process according to an embodiment.

FIG. 8 depicts a method 700 of integrating an application-specific printed circuit board of an ECU and a generic receiving component. The method 700 includes housing a connector such as the PCB 104 discussed above (701) so as to connect a first component (e.g., a generic receiving component) and a second component (e.g., an application-specific printed circuit board). The method 700 further includes disposing the connector between the first component and the second component (702). Accordingly, the connector (e.g., the PCB 104) is arranged so as to connect to the first component and the second component (703). The method 700 still further involves communicating the first component and the second component via the connector (704). As noted above, the pre-routed PCB may be housed within a ruggedized enclosure. Further, the connector may include one or a plurality of integrated circuits.

In some implementations, components may be populated or unpopulated to alter signal routing between at least one circuit on a main PCB and a connector. However, this approach may consume additional PCB space and may increase PCB variants, reducing the quantity of any particular ECU and potentially leading to higher piece part costs. Further, in some alternative implementations, an adapter harness is provided in a vehicle and uses both a common PCB and a common connection on an ECU. The adapter harness connects to an application specific connector or harness to achieve a stable connection. However, extra space is required to accommodate the adapter harness in some configurations. Further, the inclusion of another connection may potentially impact durability, and may increase warranty and production costs.

Certain above-mentioned implementations achieve a lower piece part cost for variant modules and readily serve multiple applications. They allow for a reduction in the quantity of legacy ECUs while accommodating unique footprints and connection schemes. The resulting higher volume of production for main PCBs beneficially equates to a lower piece part cost, while fewer PCB design variations reduce NRE costs. Further, a quicker time to market may beneficially be realized inasmuch as only the adapter portions may be redesigned in order to alter a pin-out scheme or to incorporate a new connection system. Further, a connection system may be optimized for particular applications. For example, a connection system may be optimized so as to meet high horsepower durability requirements which may differ from durability requirements for other applications, such as flexible fuel management applications. Thus, a single module may be used for a plurality of applications, so as to reduce the overall number of application specific modules while lowering the total cost of ownership and reducing the time to market for derivative ECUs.

As apparent from the foregoing, the above-mentioned implementations allow for expanded functionality via an adapter module. Such implementations therefore avoid drawbacks associated with unique ECUs, which require new PCBs for each unique application. In comparison to systems requiring unique PCBs to be made, the above-mentioned implementations have a lowered number of required parts, a higher volume for any given ECU version, and require support for fewer products throughout their lifetimes. Such implementations have the further advantages of generally lower piece-part costs and lower NRE costs, because the costs are shared among a higher number of modules.

Further, the implementations described above offer additional benefits in comparison to conventional systems in which components are customized to provide functionality per various application requirements, such that the number of PCB variants is generally increased. Such conventional approaches do not allow for re-configurability after the ECU is manufactured. In contrast, applicant's implementations may be configured during engine or vehicle assembly, while in service, or in the field.

Many of the functional units discussed herein have been described as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in machine-readable media for execution by various types of processors. An identified module of executable code may, for instance, comprise one or more physical or logical blocks of computer instructions, which may be organized as an object, procedure, or function. The executables of an identified module need not be physically located together, but may comprise disparate instructions stored in different locations which, when joined logically together, comprise the module and achieve the stated purpose for the module.

Further, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, as electronic signals on a system or network. Where a module or portions of a module are implemented in a machine-readable medium or media (or a computer-readable medium or media), the computer readable program code may be stored and/or propagated via at least one computer readable medium.

The computer readable medium or media may be a tangible computer readable storage medium or media storing the computer readable program code. The computer readable storage medium or media may be, for example, but is not limited to, an electronic, magnetic, optical, electromagnetic, infrared, holographic, micromechanical, or semiconductor system, apparatus, or device, or any suitable combination of the foregoing.

More specific examples of the computer readable medium or media may include but are not limited to a portable computer diskette, a hard disk, a random access memory (RAM), a read-only memory (ROM), an erasable programmable read-only memory (EPROM or flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this disclosure, a computer readable storage medium may be any tangible medium that can contain and/or store computer readable program code for use by and/or in connection with an instruction execution system, apparatus, or device.

The computer readable medium or media may also be a computer readable signal medium or media. The computer readable signal medium or media may include a propagated data signal with computer readable program code embodied therein, for example, in baseband or as part of a carrier wave. Such a propagated signal may take any of a variety of forms, including, but not limited to, electrical, electro-magnetic, magnetic or optical forms, or any suitable combination thereof. A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireless, wireline, optical fiber cable or Radio Frequency (RF) media, or the like, or any suitable combination of the foregoing.

In one implementation, the computer readable medium or media may comprise a combination of one or more computer readable storage media and one or more computer readable signal media. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++ or the like and conventional procedural programming languages, such as the C programming language or similar programming languages. The computer readable program code may execute entirely on a user's computer, partly on the user's computer, as a stand-alone computer-readable package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The program code may also be stored in a computer readable medium that can direct a computer, other programmable data processing apparatus, or other devices to function in a particular manner, such that the instructions stored in the computer readable medium produce an article of manufacture including instructions which implement the functions and/or acts specified in at least one schematic flowchart diagram and/or at least one schematic block diagram.

Reference throughout this specification to "one implementation," "an implementation," or similar language means that a particular feature, structure, or characteristic described in connection with the implementation is included in at least one implementation of the present invention. Thus, appearances of the phrases "in one implementation," or "in an implementation" and similar language throughout this specification may, but do not necessarily, all refer to the same implementation.

Accordingly, the present disclosure may be embodied in other specific forms without departing from its spirit or essential characteristics. The described implementations above are to be considered in all respects only as illustrative and not restrictive. The scope of the disclosure is, therefore, indicated by the appended claims rather than by the foregoing description. Modifications and variations are possible in light of the above teachings or may be acquired from practice of the disclosed implementations above.

What is claimed is:

1. A method of integrating an application-specific printed circuit board of an engine control module and a generic receiving component, the method comprising:
   providing a connector configured to connect a first component and a second component, the connector being configured to connect to the first component and the second component;
   disposing the connector between the first component and the second component; and
   communicating the first component and the second component via the connector,
   wherein the first component is the generic receiving component and the second component is the application-specific printed circuit board; and
   wherein the connector comprises at least one integrated circuit and an integrated pre-routed printed circuit board.

2. The method of claim 1, wherein the application-specific printed circuit board is housed within a ruggedized enclosure.

3. The method of claim 1, wherein the connector includes a plurality of integrated circuits.

4. The method of claim 1, wherein the generic receiving component and the application-specific printed circuit board are provided with a differing numbers of pins.

5. The method of claim 1, further comprising attaching the connector to a harness.

6. The method of claim 1, wherein the connector comprises a plurality of flexible circuits.

7. The method of claim 1, wherein the connector further comprises:
   a second pre-routed printed circuit board, and
   at least one flexible circuit.

8. A method of assembling at least a first printed circuit board for an engine control module and a second printed circuit board, the method comprising:
   disposing the first printed circuit board in a ruggedized enclosure, the first printed circuit board having a top layer and a bottom layer;
   arranging the first printed circuit board and the second printed circuit board such that the first printed circuit board is configured to communicate with the second printed circuit board via the top layer; and
   providing at least one of a flexible circuit or a third printed circuit board to allow communication between the first printed circuit board and the second printed circuit board,
   wherein the at least one of the flexible circuit and the third printed circuit board is configured to re-route signals from the first printed circuit board to the second printed circuit board, and
   wherein the second printed circuit board is an application-specific printed circuit board.

9. The method of claim 8, further comprising utilizing a controller provided with the second printed circuit board to regulate at least one engine characteristic.

10. The method of claim 8, wherein the third printed circuit board contains a preconfigured routing arrangement.

11. The method of claim 8, wherein the enclosure comprises at least one of aluminum, aluminum alloy or another cast alloy, or any combination thereof.

12. The method of claim 8, wherein the enclosure is configured to dissipate heat from the second printed circuit board.

13. The method of claim 8, wherein the flexible circuit is configured to connect to engine hardware.

14. The method of claim 8, wherein the first printed circuit board is provided with a first pin arrangement and the second printed circuit board is provided with a second pin arrangement.

15. The method of claim 8, wherein the first pin arrangement differs in at least one of pitch, a dimension, or an orientation from the second pin arrangement.

16. The method of claim 8, further comprising causing a same signal to be transmitted at a plurality of pins on the top layer.

17. The method of claim 8, further comprising receiving, by the flexible circuit, signals from the first printed circuit board, processing the signals, and outputting the processed signals.

18. The method of claim 8, wherein the first printed circuit board is disposed parallel to the second printed circuit board.

19. The method of claim 8, wherein the flexible circuit includes at least one of an analog connector, a driver, a battery connection, a sensor connection, or any combination thereof.

* * * * *